United States Patent [19]

Barr

[11] 4,047,111
[45] Sept. 6, 1977

[54] TUNING SYSTEM FOR AM/FM RECEIVERS

[75] Inventor: Paul N. Barr, Kokomo, Ind.

[73] Assignee: General Motors Corporation, Detroit, Mich.

[21] Appl. No.: 706,848

[22] Filed: July 19, 1976

[51] Int. Cl.² .......................................... H04B 1/16
[52] U.S. Cl. .................................. 325/315; 325/317; 325/421; 325/453
[58] Field of Search ............... 325/315, 316, 317, 419, 325/420, 421, 422, 423, 452, 453, 457

[56] References Cited

U.S. PATENT DOCUMENTS

| 3,163,823 | 12/1964 | Kellis et al. ........................ 325/453 |
| 3,345,571 | 10/1967 | Selwyn ................................ 325/317 |
| 3,665,507 | 5/1972 | Peil ..................................... 325/452 |
| 3,727,139 | 4/1973 | Gallant et al. ...................... 325/453 |
| 3,743,943 | 7/1973 | Manson et al. ..................... 325/453 |
| 3,764,917 | 10/1973 | Rhee .................................... 325/420 |
| 3,878,467 | 4/1975 | Manson et al. ..................... 325/453 |
| 3,909,723 | 9/1975 | Manson et al. ..................... 325/421 |

Primary Examiner—Benedict V. Safourek
Assistant Examiner—Tommy P. Chin
Attorney, Agent, or Firm—Albert F. Duke

[57] ABSTRACT

An integrated circuit responsive to the output of an AM local oscillator and an AFC signal for developing a DC signal for applying a tuning voltage to the front end of a FM receiver which is a function of the local oscillator frequency and the drift of the FM front end.

4 Claims, 4 Drawing Figures

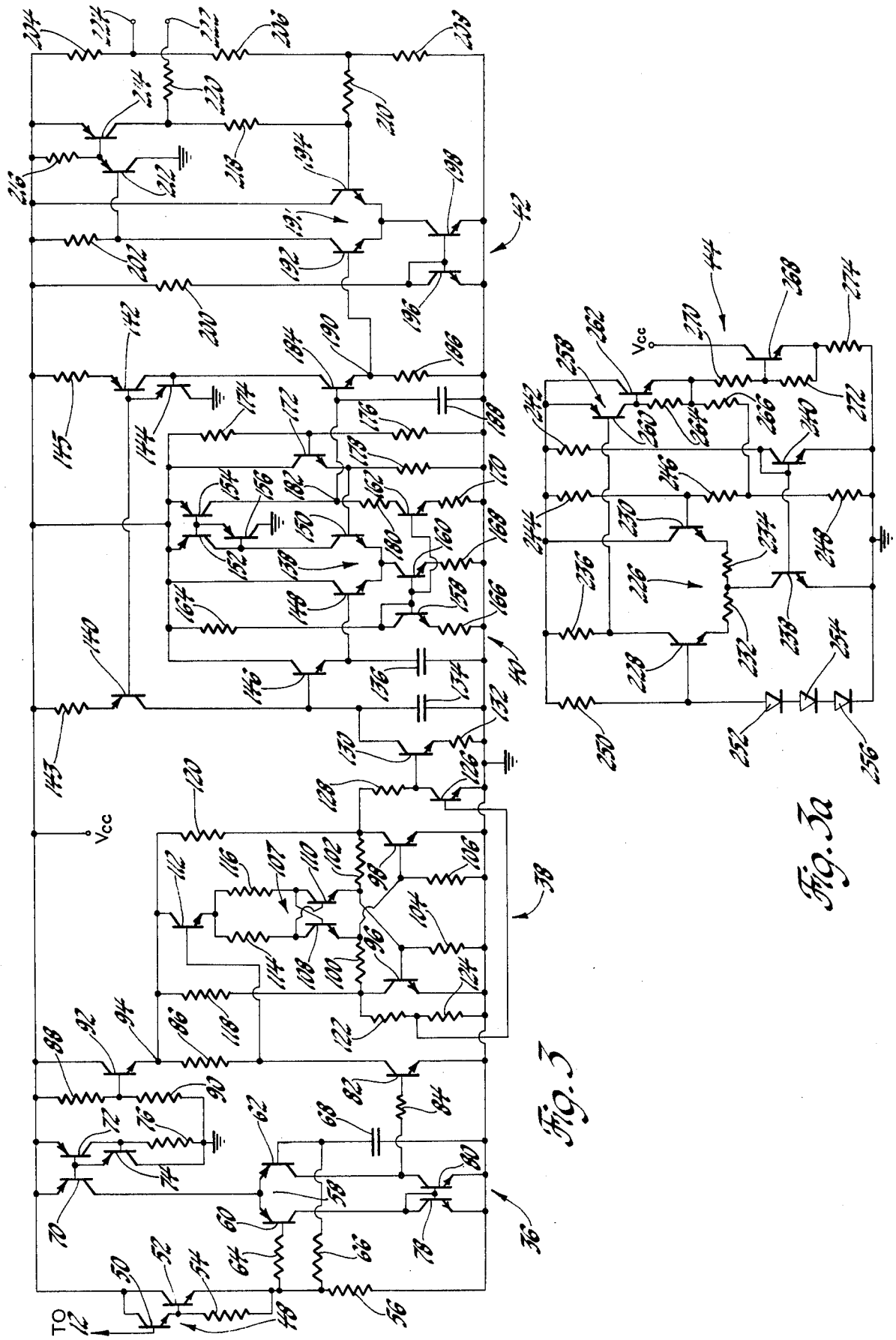

TUNING SYSTEM FOR AM/FM RECEIVERS

This invention relates to circuitry for providing a tuning voltage for an electronically tuned FM radio receiver and more particularly to an integrated circuit responsive to the output signals of a mechanically tuned AM local oscillator and to an automatic frequency control signal for developing a tuning voltage which is proportional to the frequency of the AM local oscillator, adjusted for any frequency drift of the FM tuner.

It has been proposed in the prior art to utilize the AM oscillator in a combined AM/FM receiver as a means of tuning the front end of an electronically tuned FM receiver. See, for example, the patents to Manson U.S. Pat. No. 3,878,467, Mason et al. U.S. Pat. No. 3,743,943 and Gallant et al. U.S. Pat. No. 3,727,139. Some of the problems encountered in implementing such tuning systems particularly in automobile radios are the drift problems resulting from power supply variation and temperature changes.

It is an object of the present invention to provide a monolithic integrated circuit which produces a tuning voltage which is a function of both the frequency of the local oscillator of an AM receiver and the drift of the front end of an FM receiver which voltage is substantially independent of amplitude and waveform variations of the AM local oscillator output.

It is another object of the present invention to provide an integrated circuit which is responsive to input signals derived from the local oscillator of an AM receiver to develop a DC voltage proportional thereto and is further responsive to a signal proportional to the drift of one or more components of the front end of an electronically tuned FM receiver for producing a tuning voltage which tunes one or more of said components.

These and other objects of the present invention will be more apparent from the following detailed description which should be read in conjunction with the drawings in which:

FIGS. 3 and 3a are a detailed schematic diagram of the integrated circuit of the present invention.

Figure 1:
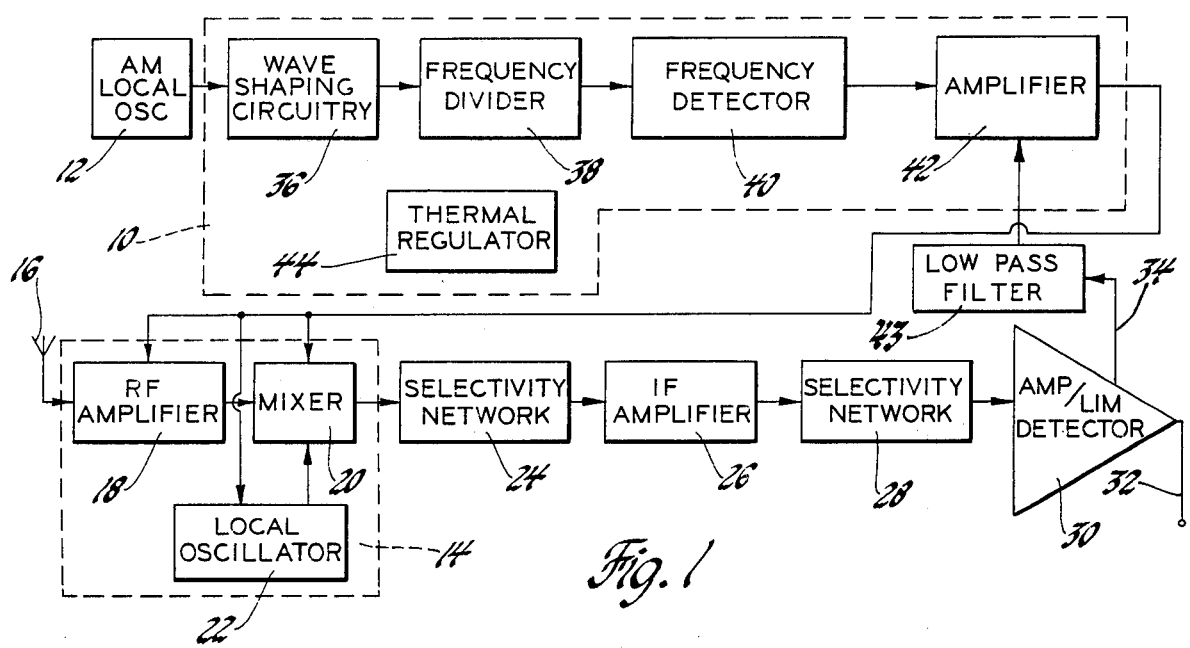
FIG. 1 is a block diagram of the integrated circuit of the present invention as connected with a conventional AM/FM receiver.

Referring now to the drawings and initially to FIG. 1, the integrated circuit of the present invention is generally designated 10. The integrated circuit 10 provides an interface between the local oscillator 12 of an AM receiver and the front end or tuner 14 of an electronically tuned FM receiver. Radio signals picked up by antenna 16 are applied to the tuner 14 which comprises an RF amplifier 18, mixer 20 and the local oscillator 22. The mixer 20 in response to the signal from the RF amplifier 18 and local oscillator 22 produces an IF signal output to selectivity network 24. Selectivity network 24 provides a band pass characteristic appropriate to the particular receiver IF operating characteristics and couples the output of the mixer 20 to the input of an IF amplifier 26. A second selectivity network 28 further defining the IF band pass, couples the IF signals from the amplifier 26 to an FM-IF subsystem generally designated 30 which includes an IF amplifier, limiter, and quadrature detector. The subsystem 30 provides an audio output on conductor 32 and an AFC output on conductor 34. A suitable FM-IF subsystem is the RCA-CA3089E disclosed in Linear Integrated Circuit application note ICAN-6257 available upon request from RCA Solid State Division, Box 3200, Summerville, New Jersey. The application note is incorporated herein.

Figure 2:
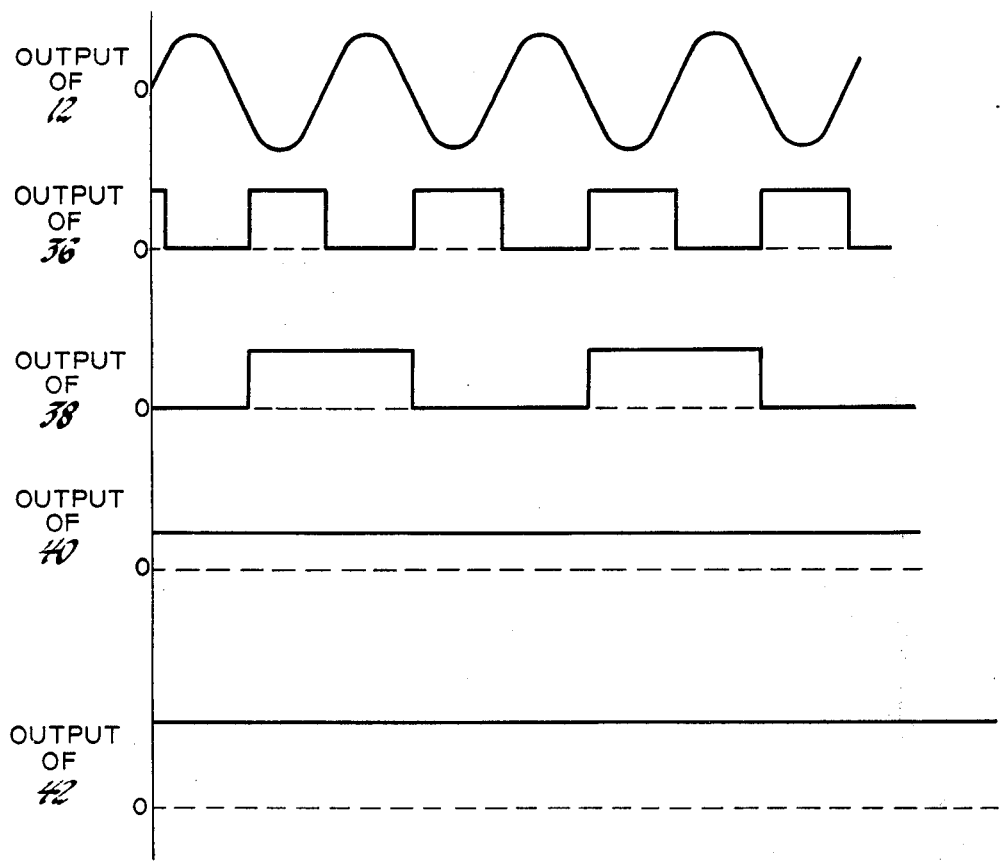
FIG. 2 shows waveforms at various points in the circuit and is useful in understanding the circuit.

The integrated circuit 10 comprises wave shaping circuitry 36, a frequency divider 38, a frequency detector 40, a DC amplifier 42 and a thermal regulator 44. The sinusoidal output of the AM oscillator 12 is applied to the wave shaping circuitry 36 which provides a square wave output as shown in FIG. 2. The variable frequency square wave output of circuitry 36 is divided by two in the frequency divider or bistable multivibrator 38 to eliminate output voltage changes due to local oscillator amplitude changes and waveform variations. The frequency detector 40 provides a low ripple DC output which is directly proportional to the input frequency. The change in the AM oscillator frequency is from 800 to 1877 KHz resulting in a low to high frequency ratio of approximately 1/2.34. This same ratio is maintained at the output of the converter 40, however, this voltage ratio is not sufficient for tuning the FM receiver over its entire frequency band. Therefore, a low gain amplifier generally designated 42 is provided for amplifying the voltage range of the detector 40. The amplifier 42 provides an output that varies from about 1.5 to about 7.8 volts which is sufficient to adjust the tuner 14 over its entire frequency band. The AFC signal on conductor 34 is averaged by a low pass filter 43 and applied to the amplifier 42 to adjust the magnitude of the output of the amplifier 42 as a function of the drift of the tuner 14. The thermal regulator 44 is included as a part of the integrated circuit 10 to reduce output drift of the chip due to ambient temperature change.

Referring now to FIGS. 3 and 3a, the AM oscillator 12 supplies a sinusoidal signal of a frequency directly related to the position of the radio dial. The signal is applied to a darlington emitter follower 48 comprising transistors 50 and 52 which present a high input impedance to the oscillator 12. A resistor 54 provides a discharge path for the parasitic capacitance of the transistors 50 and 52. A resistor 56 serves as the emitter load for transistor 52. Conversion of the sinusoidal signal to a square wave is accomplished by a differential amplifier 58 which includes transistors 60 and 62. The base of transistor 60 is coupled to the emitter follower 48 through a resistor 64. The base of transistor 62 is likewise connected to the emitter follower 48 through resistor 66 and to ground through a capacitor 68. The capacitor 68 maintains the base of transistor 62 relatively constant while the voltage at the base of transistor 60 follows the input signal to the emitter follower 48. Consequently, the amplifier 58 switches to opposite states each half cycle of the input signal. The resistor 66 and capacitor 68 provide a floating bias for transistor 62 which allows either direct or capacitive coupling of the transistor 50 to the oscillator 12. The resistors 64 and 66 are of the same value to equalize their effect on the amplifier 58. Transistors 70, 72 and 74 and resistor 76 form a current source connected with the emitters of amplifier 58 while diode-connected transistor 78 and transistor 80 provide an active load. A switching transistor 82 is coupled to the transistor 80 through a resistor 84. A resistor 86 serves as a load resistor for transistor 82. The transistors 78 and 80 amplify the output of amplifier 58 to decrease the switching time of transistor 82. Resistors 88 and 90 are connected between $V_{cc}$ and ground and forward bias a transistor 92 which establishes an operating voltage for the bistable multivibrator or flip-flop 38 at the junction 94. Flip-flop 38 includes transistors 96 and 98 and resistors 100, 102, 104 and 106. A trigger circuit 107 for flip-flop 38 includes transistors 108, 110 and 112 and resistors 114 and 116. The trigger circuit 107 is responsive to the collector voltage of transistor 82 and switches the transistors 96 and 98 to opposite states on each leading edge of output signal of the wave shaping circuitry 36 as shown in FIG. 2. The collectors of transistors 96 and 98 are connected to junction 94 through load resistors 118 and 120 respectively. Bias resistors 122 and 124 are connected with the base of a transistor 126. Resistor 128 couples the output of the flip-flop 38 to a switching transistor 130. The transistor 126 is provided for decreasing the turn-off time of transistor 130. Resistor 132 limits current flow through transistor 130.

The frequency detector 40 includes a timing capacitor 134, and an active integrator comprising integrating capacitor 136 and a differential amplifier 138. The timing capacitor 134 is connected in the feedback path of the amplifier 138. The capacitor 134 is charged to a fixed voltage from a current source including transistors 140, 142 and 144 and resistors 143 and 145. A transistor 146 responds to the voltage on the capacitor 134 to control the charging of capacitor 136. The essentially constant voltage on capacitor 136 provides one input to the differential amplifier 138 which operates in a balanced mode and includes transistors 148 and 150. Transistors 152, 154 and 156 form a current source and active load for the amplifier 138 while diode connected transistor 158, transistors 160 and 162 and resistors 164, 166, 168 and 170 form a current sink. The base of transistor 150 is controlled from a bias network comprising transistor 172 and resistors 174, 176 and 178. Resistor 180 is a start-up resistor. Transistors 154 and 162 also shift the level of the voltage at the collector of transistor 150 down to a lower level at the junction 182. An emitter follower connected transistor 184 and resistor 186 provide output buffering while a capacitor 188 filters the voltage at the junction 182.

The DC voltage appearing at the junction 190 of the detector 40 is proportional to the frequency of the local oscillator 12 and is applied to the DC amplifier circuitry 42 which includes a differential amplifier 191 including transistors 192 and 194. Diode connected transistor 196, transistor 198 and resistor 200 form a current sink for the amplifier 191. Load resistor 202 connects the collector of transistor 192 to V+. The bias network for the transistor 194 includes resistors 204, 206, 208 and 210. Transistors 212, 214 and resistor 216 provide additional amplification of the output signal of the amplifier 191 with the amount of gain being established primarily by the resistors 218 and 210 and secondarily by the resistors 204, 206 and 208. The resistor 220 provides current limiting protection to the transistor 214. The amplifier 42 amplifies the voltage at the junction 190 so that it appears at the junction 222 with sufficient range to tune the FM receiver over its entire frequency band. The AFC signal from the subsystem 30 is applied to the junction 224. The AFC current fed back to the junction 224 from the subsystem 30 will increase or decrease as the FM receiver drifts on either side of the center of the familiar S-curve. The AFC current changes the bias of the transistor 194 thereby raising or lowering the voltage at the junction 222 which is applied to the varactor diodes in the FM tuner section 14. Consequently, the voltage supplied to the tuner 14 is not only in accordance with the desired tuning frequency but is also adjusted to compensate for drift of the FM tuner 14.

The AFC signal may be applied to the junction 190 rather than the junction 224 and effect an output voltage change in the opposite direction at junction 222 if such is desired.

The thermal regulator circuit 44 provides heating to the chip whenever the ambient temperature drops below approximately 25° C. The circuit 44 comprises a differential amplifier 226, including transistors 228, 230, emitter resistors 232, 234 and load resistor 236. Transistor 238, diode connected transistor 240 and resistor 242 form a current sink for amplifier 226 while resistors 244, 246 and 248 provide bias for the transistor 230 to establish a reference voltage. The voltage at the base of transistor 228 is established by a resistor 250 and diodes 252, 254 and 256. An amplifier 258 includes transistors 260, 262 and resistor 264. The base of transistor 260 is driven by the collector voltage of transistor 228 and the emitter of transistor 262 is connected with the bias network of transistor 230 through a feedback resistor 266. The amplifier 226 drives a power transistor 268 through a current limiting resistor 270. Resistor 272 provides base-emitter bias for transistor 268 while bias resistor 274 limits the emitter current of transistor 268 and provides current feedback. Whenever the ambient temperature is above the threshold temperature, transistor 230 is fully conducting and transistor 228 is cut off which results in transistor 268 being cut off and no heating takes place. Below the threshold temperature, the amplifier 226 begins its change in state as sensing diodes 252, 254 and 256 are affected by ambient temperature. This allows transistor 268 to also begin conducting which applies heat to the integrated circuit and associated package. Equilibrium is established when the difference between the heat applied to the I.C. and the ambient temperature are sufficient to maintain the I.C. temperature relatively constant.

Having thus described my invention what I claim is:
1. In a combination AM and FM receiver including an AM local oscillator, electronically tunable FM tuner means, and automatic frequency control means providing a first DC signal having an amplitude proportional to drift of said FM tuner, the improvement comprising a circuit for detecting the frequency of said AM local oscillator and for supplying a tuning voltage to said FM tuner, said circuit comprising amplifier means for amplifying the AC input from said AM local oscillator for providing a trigger signal each half cycle of said AC input, frequency divider means responsive to said trigger signal for producing a square wave signal at one half the frequency of said local oscillator signal, frequency detector means responsive to the output of said frequency divider means for developing a second DC signal having an amplitude proportional to the frequency of said AM local oscillator, DC amplifier means responsive to said first and second DC signals for supplying to said tuner a voltage which is an amplified version of said first DC signal, adjusted to compensate for any drift of said tuner.

2. In a combination AM and FM receiver including an AM local oscillator, electronically tunable FM tuner means, and automatic frequency control means providing a first DC signal having an amplitude proportional to drift of said FM tuner, the improvement comprising a circuit for detecting the frequency of said AM local oscillator and for supplying a tuning voltage to said FM tuner, said circuit comprising amplifier means for amplifying the AC input from said AM local oscillator for providing a trigger signal each half cycle of said AC input, frequency divider means responsive to said trigger signal for producing a square wave signal at one half the frequency of said local oscillator signal, frequency detector means responsive to the output of said frequency divider means for developing a second DC signal having an amplitude proportional to the frequency of said AM local oscillator, DC amplifier means responsive to said first and second DC signals for supplying to said tuner a voltage which is an amplified version of said first DC signal, adjusted to compensate for any drift of said tuner and a thermal regulator circuit responsive to ambient temperature for maintaining said integrated circuit at a substantially stable temperature.

3. In a combination AM and FM receiver including an AM local oscillator, electronically tunable FM tuner means, and automatic frequency control means providing a first DC signal having an amplitude proportional to drift of said FM tuner, the improvement comprising an integrated circuit for detecting the frequency of said AM local oscillator and for supplying a tuning voltage to said FM tuner, said integrated circuit comprising amplifying means for amplifying the AC input from said local oscillator for providing a trigger signal each half cycle of said AC input, bistable multivibrator responsive to said trigger signal for producing a square wave signal at one half the frequency of said local oscillator signal, frequency detector means including an active integrator and a timing capacitor, said active integrator including a differential amplifier having a high open loop gain and an integrating capacitor, said timing capacitor being connected in the feedback loop of said differential amplifier, said frequency detector means developing a second DC signal having an amplitude proportional to the frequency of said AM local oscillator, a second differential amplifier responsive to the output of said frequency detector means and to said first DC signal, said second differential amplifier producing a tuning voltage output adjusted to compensate for any drift of said FM tuner, and means connecting the output of said differential amplifier to said tuner means.

4. In a combination AM and FM receiver including an AM local oscillator, electronically tunable FM tuner means, and automatic frequency control means providing a first DC signal having an amplitude proportional to drift of said FM tuner, the improvement comprising an integrated circuit for detecting the frequency of said AM local oscillator and for supplying a tuning voltage to said FM tuner, said integrated circuit comprising amplifying means for amplifying the AC input from said local oscillator for providing a trigger signal each half cycle of said AC input, bistable multivibrator responsive to said trigger signal for producing a square wave signal at one half the frequency of said local oscillator signal, frequency detector means including an active integrator and a timing capacitor, said active integrator including a differential amplifier having a high open loop gain and an integrating capacitor, said timing capacitor being connected in the feedback loop of said differential amplifier, said frequency detector means developing a second DC signal having an amplitude proportional to the frequency of said AM local oscillator, a second differential amplifier responsive to the output of said frequency detector means and to said first DC signal, said second differential amplifier producing a tuning voltage output adjusted to compensate for any drift of said FM tuner, and means connecting the output of said differential amplifier to said tuner means and a thermal regulator circuit comprising a third differential amplifier, means responsive to a drop in ambient temperature for switching the state of said third differential amplifier, and a power transistor adapted to be rendered conductive in response to a change in state of said third differentail amplifier to raise the temperature of said integrated circuit.

* * * * *